(12) United States Patent
Nekoogar et al.

(10) Patent No.: US 9,530,090 B2
(45) Date of Patent: Dec. 27, 2016

(54) SECURE RFID TAG OR SENSOR WITH SELF-DESTRUCTION MECHANISM UPON TAMPERING

(71) Applicants: Faranak Nekoogar, San Ramon, CA (US); Farid Dowla, Castro Valley, CA (US); Richard Twogood, San Diego, CA (US); Scott Lefton, Melrose, MA (US)

(72) Inventors: Faranak Nekoogar, San Ramon, CA (US); Farid Dowla, Castro Valley, CA (US); Richard Twogood, San Diego, CA (US); Scott Lefton, Melrose, MA (US)

(73) Assignee: Dirac Solutions Inc., Pleasanton, CA (US)

( * ) Notice: Subject to any disclaimer, the term of this patent is extended or adjusted under 35 U.S.C. 154(b) by 95 days.

(21) Appl. No.: 14/714,204

(22) Filed: May 15, 2015

(65) Prior Publication Data

US 2015/0339568 A1    Nov. 26, 2015

Related U.S. Application Data

(60) Provisional application No. 62/000,629, filed on May 20, 2014.

(51) Int. Cl.
| G06K 19/06 | (2006.01) |
| G06K 19/077 | (2006.01) |
| H05K 5/02 | (2006.01) |
| H05K 1/02 | (2006.01) |
| G06K 19/073 | (2006.01) |

(52) U.S. Cl.
CPC ... *G06K 19/07798* (2013.01); *G06K 19/07381* (2013.01); *H05K 1/0275* (2013.01); *H05K 5/0208* (2013.01); *H05K 5/0221* (2013.01); *H05K 2201/10098* (2013.01); *Y10T 225/371* (2015.04)

(58) Field of Classification Search
USPC .................... 235/492, 451; 340/572.3, 572.8
See application file for complete search history.

(56) References Cited

U.S. PATENT DOCUMENTS

| 4,097,894 A | 6/1978 | Tanner |
| 5,898,370 A | 4/1999 | Reymond |

(Continued)

*Primary Examiner* — Ahshik Kim

(57) ABSTRACT

A circuit board anti-tamper mechanism comprises a circuit board having a frangible portion, a trigger having a trigger spring, a trigger arming mechanism actuated by the trigger wherein the trigger arming mechanism is initially non-actuated, a force producing mechanism, a latch providing mechanical communication between the trigger arming mechanism and the force producing mechanism, wherein the latch initially retains the force producing mechanism in a refracted position. Arming pressure applied to the trigger sufficient to overcome the trigger spring force will actuate the trigger arming mechanism, causing the anti-tamper mechanism to be armed. Subsequent tampering with the anti-tamper mechanism results in a decrease of pressure on the trigger below the trigger spring force, thereby causing the trigger arming mechanism to actuate the latch, thereby releasing the force producing mechanism to apply force to the frangible portion of the circuit board, thereby breaking the circuit board.

50 Claims, 14 Drawing Sheets

(56) References Cited

U.S. PATENT DOCUMENTS

| | | |
|---|---|---|
| 7,800,504 B2 | 9/2010 | Teeter |
| 7,898,422 B2 | 3/2011 | Puccini |
| 8,274,389 B2 | 9/2012 | Teeter |
| 8,710,991 B2 | 4/2014 | Teeter |
| 2006/0214789 A1* | 9/2006 | Posamentier ...... G06K 19/0716 340/545.6 |
| 2008/0198011 A1* | 8/2008 | Leper ................. G08B 13/1445 340/572.1 |
| 2010/0283578 A1 | 11/2010 | Henderson |
| 2014/0167964 A1* | 6/2014 | Teeter ................... G09F 3/0317 340/572.3 |
| 2015/0310715 A1* | 10/2015 | Nekoogar .......... G08B 13/2417 340/572.1 |

* cited by examiner

SECURE RFID TAG OR SENSOR WITH SELF-DESTRUCTION MECHANISM UPON TAMPERING

RELATED APPLICATIONS

This patent application claims the benefit under 35 USC 119(e) of U.S. Provisional Patent Application No. 62/000,629, filed on May 20, 2014 and entitled "Secure RFID Tag Or Sensor With Self-Destruction Mechanism Upon Tampering", the entirety of which is incorporated herein by reference.

CONTRACTUAL ORIGIN OF THE INVENTION

The United States Government has rights in this invention pursuant to Contract DE-AC52-07NA27344 between the United States Department of Energy and Lawrence Livermore National Security, LLC, for the operation of Lawrence Livermore National Laboratory.

FIELD OF THE INVENTION

The present invention relates generally to an anti-tamper mechanism configured to destroy the contents of an enclosure if the enclosure is tampered with or detached from a mounting surface, and more particularly to a mechanism configured to destroy a printed circuit board containing an RFID circuit or sensor if tampering or removal is attempted.

DESCRIPTION OF THE PRIOR ART

Passive RFID tags are a convenient means for monitoring the location of critical or high-value items, since no batteries are required for tag function and fixed and/or mobile interrogation devices can be used to query the tags. Maintaining tag security is often accomplished by hiding the tag inside the item being monitored, or in the case of a tag secured to a surface, it is well known in the art to adhere the tag in such a fashion as to ensure tag destruction by shearing or tearing if the tag is removed from the surface of the item. Tag destruction results in a failure to respond to tag interrogation, which can then cause an alarm condition. The former approach works best with items that are radio-transparent in the frequencies used for tag interrogation, and the latter approach works best with small flexible tags of the printed foil variety.

More sophisticated RFID tags may incorporate printed circuit boards and circuitry containing data storage, data manipulation or encryption technologies, and may have antennas designed for data reception and transmission over greater distances and for more power than the simpler and more common RFID tags. Such tags are larger, more electrically and physically complex, and are not fabricated as small flexible structures. Tamper-proofing through tag destruction for this style of tag often requires the cutting of wires or circuit traces or actual breakage of the circuit board, which may require a portion of the circuit board to be scored, selectively perforated, or otherwise intentionally weakened to facilitate controlled breakage and thus the permanent removal of circuit function. Other anti-tampering strategies for rendering electronic circuits inoperative are also well known in the art, using such means as permanently changing a circuit's electrical characteristics, and using relatively high voltage or current to destroy components. Since RFID tags of this level of sophistication are most likely used to monitor exceptionally critical or high-value items, tamper-proofing is essential and tag destruction must be ensured with the assistance of specific actuation triggers, as well as means including mechanical force amplification such as spring mechanisms. Tags of this variety often require a housing or enclosure for environmental protection and concealing of the tamper-proofing function. Ideally, the item being monitored could serve as such an enclosure, but if the item is made of a material that is not radio-transparent such as a metal container, then a separate external enclosure is needed for the tag. Further, the contents of the item may not be compatible with the electrical circuitry of the RFID tag, or opening the item to install the tag may be difficult, impractical, or even hazardous. Thus, in many cases it is necessary to mount the more sophisticated RFID tag to the outside of the item being monitored.

External mounting of an RFID tag raises the challenges of environmental sealing, and of tamper or removal prevention. It is desirable for the tag to be easy to attach to the item being monitored, while being difficult to remove. It is also desirable for the tag anti-tamper mechanism to be easy to activate and extremely difficult or impossible to deactivate.

U.S. Pat. No. 8,710,991 entitled DISPOSABLE AND TAMPER RESISTANT RFID LOCK teaches a housing containing an RFID tag and a spring-loaded mechanism which includes a locking or ratcheting stem engaged by a connector such that tampering either causes the stem or the connector to break and release the spring, which then expands to drive a puncturing element through a functional portion of the RFID tag and thereby render it nonfunctional. The '991 patent also teaches means to crush or sever portions of the RFID tag, and also teaches adhesive means for attaching the housing to an object. However, while the '991 patent teaches the use of a releasable spring mechanism to destroy an RFID tag in response to tampering, and the spring expansion is sudden and destructive, there is no discrete trigger, and the device is not unitary and requires the user to first attach the multiple parts of the housing to an object through openings in such a way as to arm it, and then install the RFID tag into the armed housing.

U.S. Pat. No. 8,274,389 entitled DISPOSABLE AND TAMPER RESISTANT RFID LOCK teaches a housing containing a foil type RFID tag and a spring-loaded mechanism which includes a locking or ratcheting stem engaged by a connector such that tampering either causes the stem to break or the connector to loosen and release the spring, which then expands to crush the RFID tag and render it nonfunctional. However, while the spring expansion is sudden and destructive, the device taught by the '389 patent requires the user to first attach the multiple parts of the housing to an object through openings in such a way as to arm it, and then install the RFID tag into the armed housing. There is no means taught for environmentally sealing the opening through which the RFID tag is installed, and specific mechanical attachment features must be present on the item being monitored. Further, the mechanism is designed to work with a small flexible RFID tag, not an RFID tag with a rigid circuit board and a more sophisticated antenna.

U.S. Pat. No. 7,800,504 entitled DISPOSABLE AND TAMPER RESISTANT RFID LOCK teaches a housing containing an RFID tag and a spring-loaded mechanism which includes a ratcheting stem retained such that tampering causes the stem to break and release the spring, which then expands to drive a cutting blade through the RFID tag, cutting it in half and rendering it nonfunctional. However, the device taught by the '504 patent requires the user to first attach a portion of the housing to an object through openings in such a way as to arm it, and then install the RFID tag into the armed housing portion, and then finish assembling the housing. Specific mechanical attachment features must be present on the item being monitored, and further, the mechanism is designed to work with a small flexible RFID tag, not an RFID tag with a rigid circuit board and a more sophisticated antenna.

U.S. Pat. No. 5,898,370 entitled SECURITY MONITORING SYSTEM AND METHOD teaches an RFID tag that can include a circuit built on a substrate that is scored or otherwise rendered breakable along a predetermined axis or in a predetermined direction. Thus, when the tag is subject to manipulation or other mechanical tampering, the circuit substrate will break and the tag is rendered inoperable. However, the device taught by the '370 patent lacks any trigger or spring or means to control or amplify the breaking forces resulting from tampering.

U.S. Pat. No. 4,097,894 entitled SECURED SCRAMBLE DECODER FILTER teaches a circuit mounted on a fragile substrate in a housing containing an anti-tamper mechanism. The mechanism is triggered by attempts to remove the housing from the surface it has been attached to. When triggered, the mechanism releases a torsion spring which snaps against the fragile substrate, breaking it and destroying the circuit. Installation of the filter requires a special tool, and the filter can only be mounted to surfaces that a screw can be driven into. Unfortunately, anyone with access to the special tool or with the ability to manufacture a reasonably close substitute will be able to remove the filter without triggering the destruct feature.

U.S. Patent Application No. 20100283578 entitled TRANSPONDER BOLT SEAL AND A HOUSING FOR A TRANSPONDER teaches an RFID circuit and antenna enclosed within a housing intended to lock to a bolt. The bolt may be placed through a shipping container door or similar lock hasp and secured through the housing, thus serving to lock the door. The housing contains a mechanism which is armed by the bolt insertion, wherein any attempts to remove the bolt or pry loose the housing will activate a trigger which releases a spring which will destroy the RFID circuit. However, the mechanism taught by the '578 application is very specific to a bolt insertion and removal through a specific container geometry, and further, the bolt and housing are separate parts which must be joined by the user.

A more robust, capable and easy-to-install tamper-proof RFID tag or other wireless sensor would include a simple and reliable means for permanently attaching the monitoring device to an item without requiring separate hardware or specific mechanical attachment features, a means for automatically arming the monitoring device during attachment, an enclosure providing full environmental protection while being radio-transparent, a specific triggering mechanism to be actuated by tampering or removal attempts, a means to prevent false triggering from mechanical shock, impact, or vibration, and a destruct mechanism with sufficient force to positively destroy the RFID tag in a difficult-to-repair fashion if the triggering mechanism is actuated.

SUMMARY

A circuit board anti-tamper mechanism comprises a circuit board comprising at least a frangible portion containing electronic circuitry, a trigger having a trigger spring which applies a release force to the trigger, a trigger arming mechanism actuated by the trigger wherein the trigger arming mechanism is initially non-actuated, a force producing mechanism, a latch providing mechanical communication between the trigger arming mechanism and the force producing mechanism, the latch initially retaining the force producing mechanism in a retracted position, wherein arming pressure applied to the trigger sufficient to overcome the release force will actuate the trigger arming mechanism, causing the anti-tamper mechanism to be armed, and wherein subsequent tampering with the anti-tamper mechanism results in a decrease of pressure on the trigger below the pressure of the release force, thereby causing the trigger arming mechanism to actuate the latch, thereby releasing the force producing mechanism, thereby permitting the force producing mechanism to apply force to the circuit board, thereby fragmenting the circuit board and rendering the electronic circuit portion non-functional.

According to another aspect of the present invention, attaching the anti-tamper mechanism to a surface causes the trigger to actuate the trigger arming mechanism.

According to yet another aspect of the present invention, a portion of the circuit board is made frangible by features selected from the group consisting of holes, slots, and grooves. The frangible portion contains active circuitry, thereby substantially increasing the difficulty of repairing the RFID circuit if the anti-tamper mechanism is actuated. The active circuitry includes circuitry from the group consisting of RFID circuits, microcontrollers, microprocessors, sensor circuits, signal processing circuits, and wireless device circuits.

According to still another aspect of the present invention, the range of trigger motion necessary to actuate the trigger arming mechanism is the trigger arming travel and the range of trigger motion necessary to result in the actuation of the latch is the trigger release travel, and the trigger arming travel is greater than the trigger release travel. The trigger arming travel is in the range of approximately 0.180" to 0.220" and the trigger release travel is in the range of approximately 0.050" to 0.070".

According to yet still another aspect of the present invention, the circuit board anti-tamper mechanism further comprises an enclosure wherein at least the majority of the anti-tamper mechanism including the circuit board is enclosed within the enclosure, which provides environmental protection and visual concealment to the anti-tamper mechanism and the circuit board, wherein a portion of the trigger protrudes outside of the enclosure, and the enclosure includes means for environmentally sealing around the protruding portion of the trigger, while permitting the trigger to move as required for arming and release. The means for environmental sealing comprises the protruding portion of the trigger being enclosed in an opaque flexible sheath sealed to the enclosure, thereby permitting external arming and release of the trigger while maintaining environmental protection and visual concealment of the contents of the enclosure. The enclosure at least partially comprises a base and a cover, and an adhesive covering at least a portion of the base for the purpose of attaching the enclosure to a surface. The adhesive may be a continuous ring of VHB tape approximately bordering the periphery of the base, with the adhesive thereby enclosing a region of the base when the base is attached to a surface, the adhesive thereby providing an environmental seal to the enclosed region of the base when the base is attached to a surface, and wherein the protruding portion of the trigger is disposed within the enclosed region of the base when the base is attached to a surface. The base may be made of a lightweight durable metal and the cover may be made of a durable polymer, and the cover may be permanently affixed and environmentally sealed to the base with a structural adhesive. Attaching the enclosure to a surface with the adhesive causes the trigger arming mechanism to be actuated. Removing the attached enclosure from a surface causes the trigger arming mechanism to actuate the latch, thereby actuating the anti-tamper mechanism and fragmenting the circuit board. Once the anti-tamper mechanism is armed, the anti-tamper mechanism cannot be disarmed.

According to a further aspect of the present invention, the latch includes means for preventing accidental actuation caused by mechanical shock, impact or vibration. The means for preventing accidental actuation comprises requiring the force producing mechanism to have an increase in stored mechanical energy before release of the force producing mechanism can occur.

OBJECTS AND FEATURES OF THE INVENTION

It is an object of the present invention to provide an RFID tag or sensor in a tamper-proof enclosure including a destruct mechanism actuated by tampering or removal attempts.

It is another object of the present invention that the tamper-proof enclosure be environmentally rugged.

It is yet another object of the present invention that the tamper-proof enclosure be environmentally sealed.

It is still another object of the present invention that the tamper-proof enclosure be mountable to a surface without using any mechanical hardware.

It is a further object of the present invention that once the destruct mechanism is armed, it cannot be disarmed.

It is a feature of the present invention that the tamper-proof enclosure be formed from a lightweight metal base and a radio-transparent polymer cover.

It is another feature of the present invention that the enclosure base and cover be permanently joined with adhesive.

It is yet another feature of the present invention that the enclosure base be ringed with a VHB tape in order to provide a means for attachment to a surface.

It is still another feature of the present invention that a trigger pin protrudes from the enclosure base.

It is a further feature of the present invention that the trigger pin is enclosed in a flexible sheath which is sealed to the enclosure base.

It is a yet further feature of the present invention that the action of pressing the enclosure base and the VHB tape against a surface also serves to depress the trigger pin, thereby arming the destruct mechanism.

It is a still further feature of the present invention that the action of lifting the enclosure base away from a surface that it has been pressed against will allow the trigger pin to extend, thereby actuating the destruct mechanism.

It is an additional feature of the present invention that the trigger pin travel required to actuate the destruct mechanism is substantially less than the trigger pin travel required to arm the destruct mechanism.

It is a yet additional feature of the present invention that the destruct mechanism is configured to resist accidental actuation due to mechanical shock, impact, or vibration.

BRIEF DESCRIPTION OF THE DRAWINGS

The present version of the invention will be more fully understood with reference to the following Detailed Description in conjunction with the drawings of which.

DESCRIPTION OF THE PREFERRED EMBODIMENTS

Figure 1:
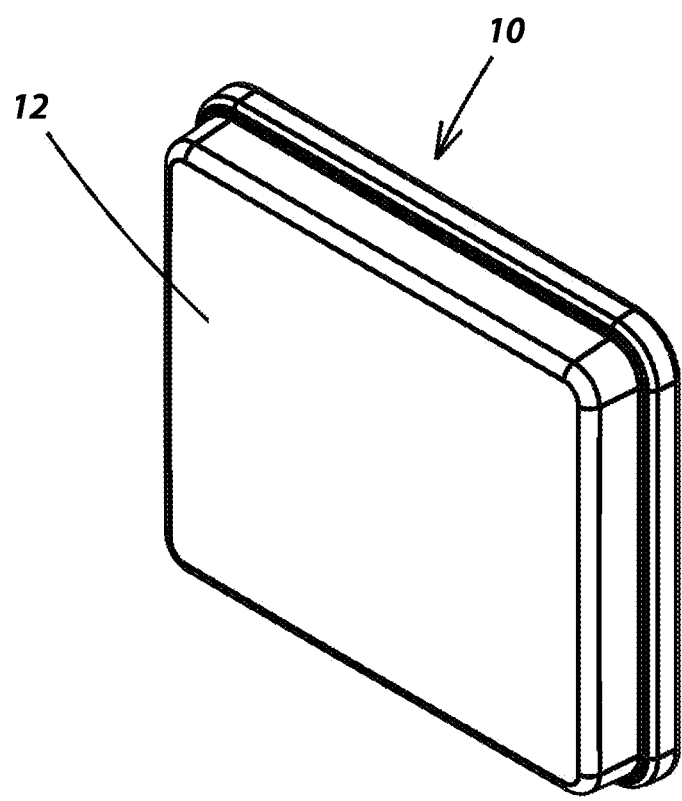
FIG. 1 is a perspective view of a secure RFID tag enclosure.
Figure 2:
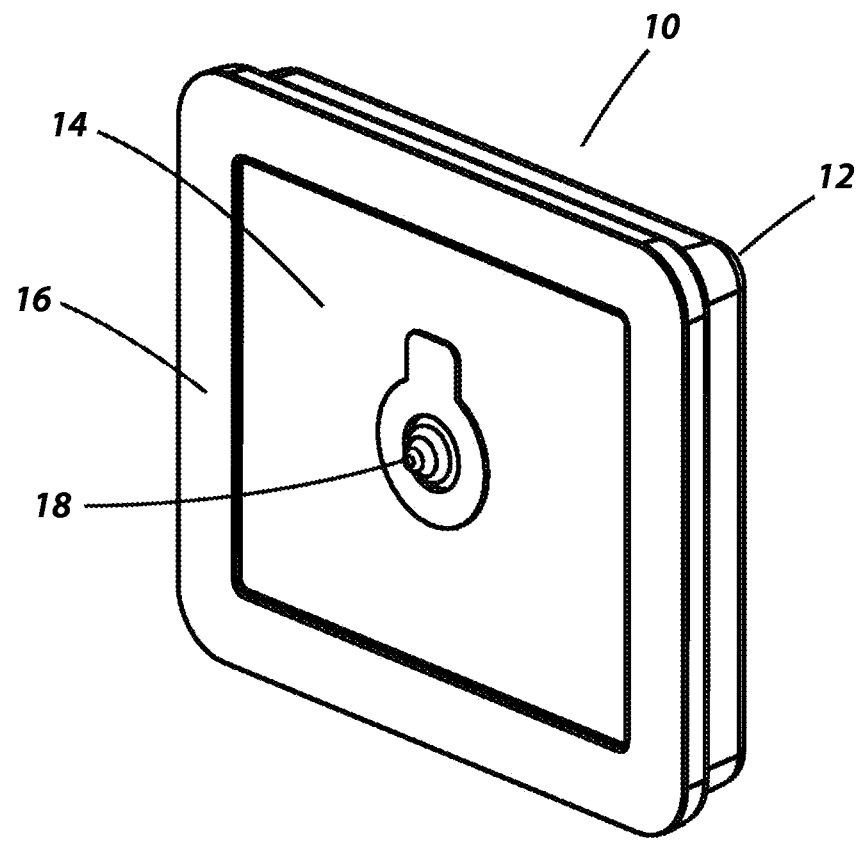
FIG. 2 is a bottom perspective view of a secure RFID tag enclosure.
Figure 3:
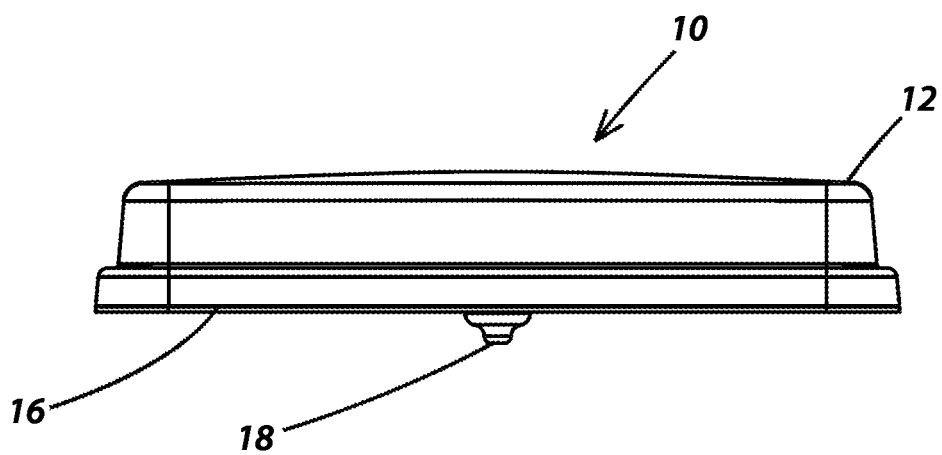
FIG. 3 is an elevation view of a secure RFID tag enclosure.

FIGS. 1-3 show the present invention secure RFID tag enclosure 10, which is approximately 7" wide by 6" high by 1" deep. It is within the scope of the present invention for the enclosure 10 to be realized with different dimensions too. Preferably the tag enclosure footprint is as small as is practical. The enclosure cover 12 is preferably made from a polymer such as injection molded polycarbonate for durability, ease of manufacturing, ease of adhering to the base plate, and radio transparency. The enclosure base 14 is preferably made from a lightweight durable metal such as aluminum for strength, rigidity, low weight and ease in manufacturing. For use in a wide variety of environments, the enclosure base 14 is preferably coated with an environmentally rugged finish such as a military-grade anodized hardcoat. A ring of adhesive 16 is preferably applied to the enclosure base 14 and used to secure the enclosure 10 to a surface. The adhesive 16 is preferably a Very High Bond (VHB) structural tape, where the thickness of the adhesive is calculated into the function of the triggering mechanism, thus providing the correct travel for both arming and actuating the destruct mechanism. This VHB tape preferably approximately follows the periphery of the enclosure base 14. A structural adhesive such as epoxy, acrylic or urethane is preferably used to attach the enclosure cover 12 to the enclosure base 14, providing an environmentally sealed tag. At the center of the enclosure base 14 is a flexible sheath 18 for environmental sealing of a trigger. The flexible sheath 18 is a preferred means of environmentally sealing the protruding portion of the trigger, however any means for environmentally sealing around the protruding portion of the trigger, while permitting the trigger to move as required for arming and release, is seen as being within the scope of the present invention. If the adhesive 16 forms a continuous ring surrounding the protruding portion of the trigger, attaching the enclosure 10 to an appropriately sealed surface may serve to environmentally seal the trigger, even if other means for environmental sealing are not present.

The flexible sheath 18 is preferably molded from an elastomer and secured into the enclosure base 14 with a conformal and flexible sealing adhesive such as a liquid, gel or VHB tape. Preferably, the flexible sheath 18 is opaque in order to conceal the contents of the enclosure 10. A portion of the trigger protrudes from the enclosure base 14 inside the flexible sheath 18 and is depressed inwards to arm the destruct mechanism when the enclosure base 14 and adhesive 16 are pressed against a surface. The trigger and the flexible sheath 18 are preferably centered under the enclosure base 14, and the enclosure 10 itself as shown is preferably as close as possible to square in shape so that the lift angle for triggering is equal in all four directions. Alternatively, a circular enclosure with the trigger centered would also provide equal lift angle in all directions. It is within the scope of the present invention to use an enclosure with any approximately radially symmetrical shape, as long as the trigger may be approximately centered.

Figure 4:
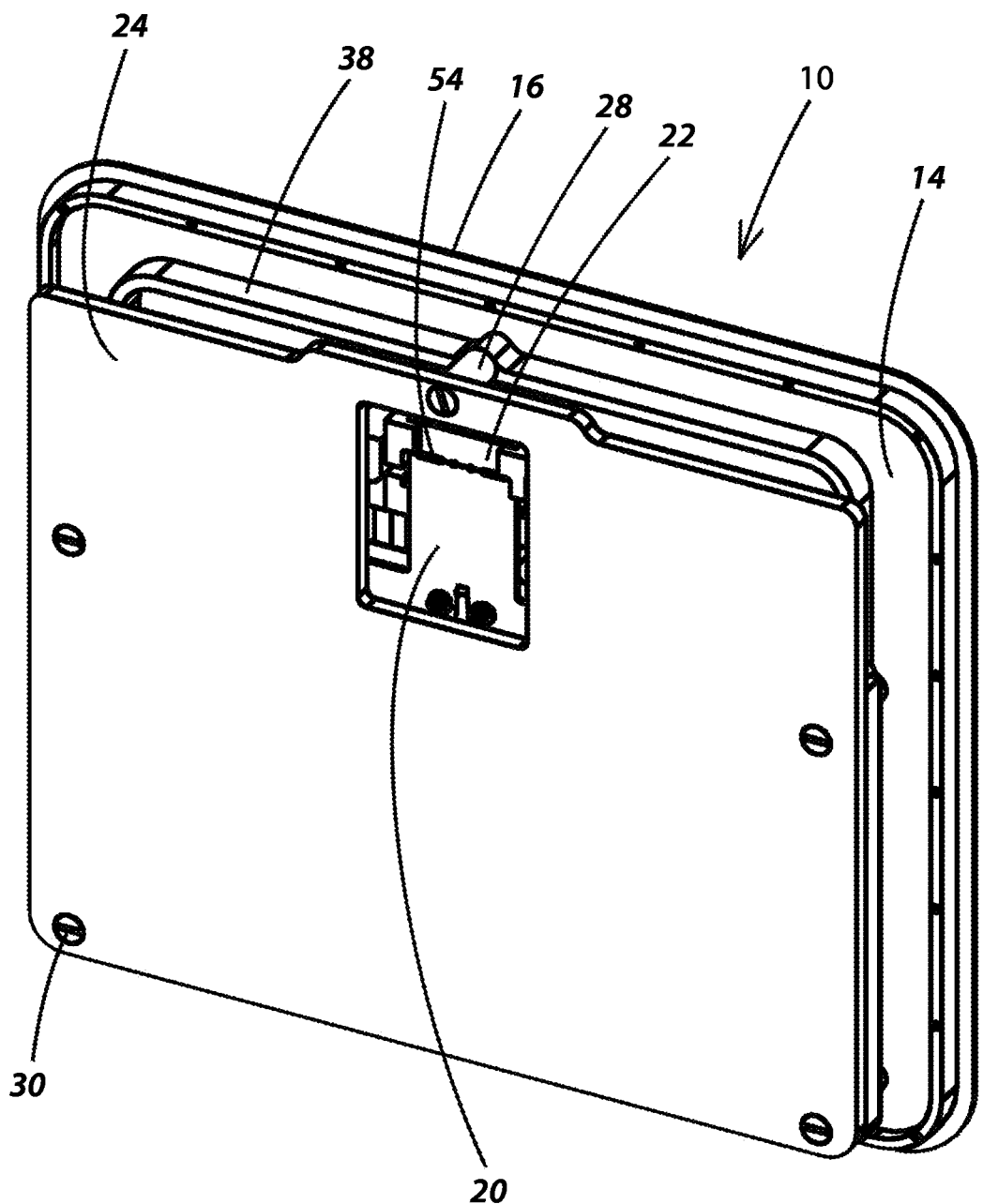
FIG. 4 is a perspective view of a secure RFID tag enclosure with the enclosure cover removed.

FIG. 4 shows the secure RFID tag 10 with the cover 12 removed. A first antenna portion 24 is mounted on insulating standoffs 28 and is attached to the antenna support 38 portion of the enclosure base 14 with antenna fasteners 30. The circuit board 20 and a frangible portion of the circuit board 22 are visible through an opening in the first antenna portion 24. The circuit board weakening feature 54 is visible between the circuit board 20 and the frangible portion of the circuit board 22. The opening in the first antenna portion 24 permits the destruct mechanism to pivot upwards far enough to ensure full board breakage. Preferably, active circuitry such as transistors, integrated circuits or hybrid modules are included on the frangible portion of the circuit board 22 so that breakage of the circuit board 20 will become substantially more difficult to repair after a tampering attempt. Preferably, the functionality of the active circuitry included on the frangible portion of the circuit board 22 may include RFID circuits, microcontrollers, microprocessors, sensor circuits, signal processing circuits, and wireless device circuits.

Figure 5:
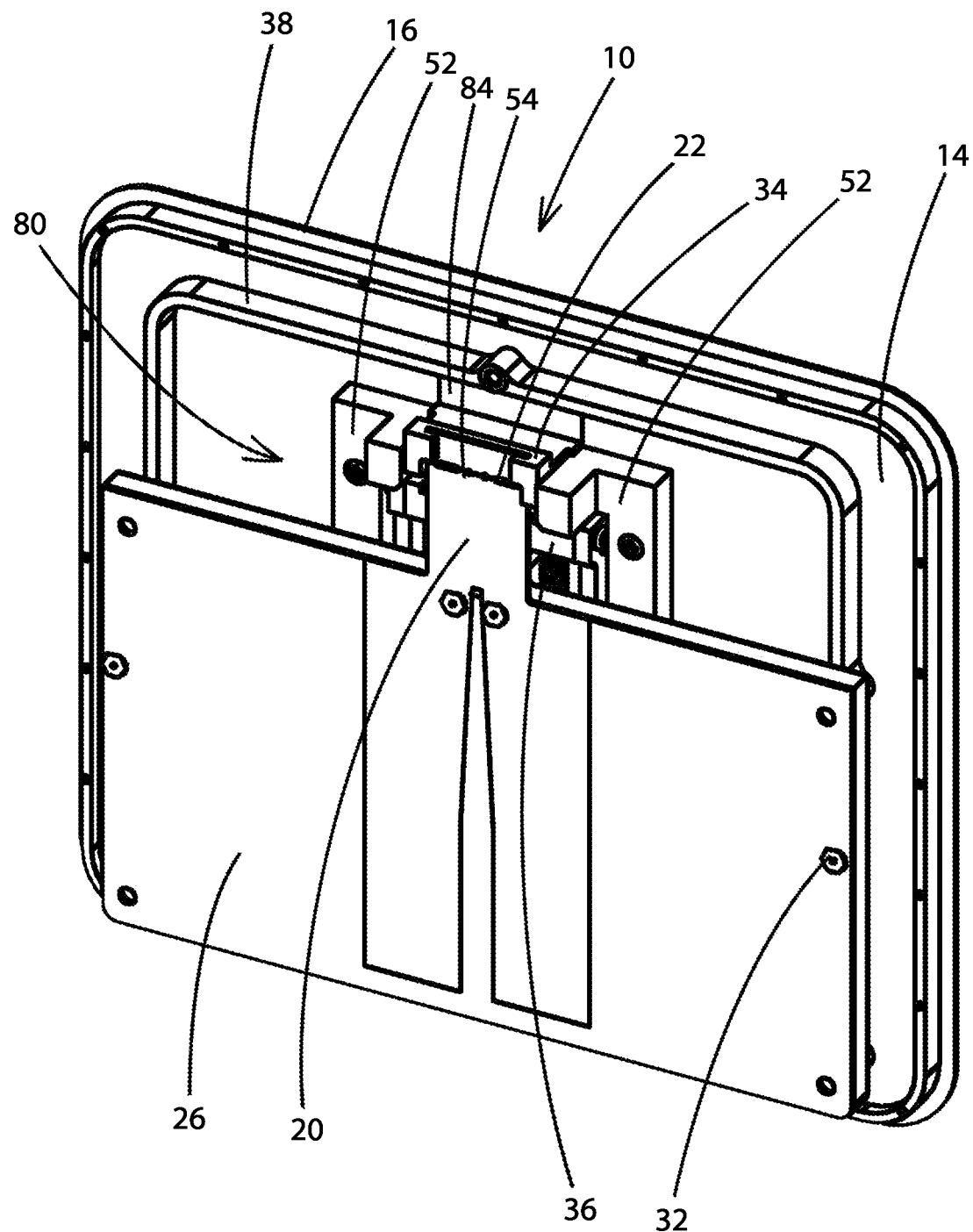
FIG. 5 is a perspective view of a secure RFID tag enclosure with the first antenna portion, insulating standoffs, and antenna fasteners removed.

FIG. 5 shows the secure RFID tag 10 with the first antenna portion 24 removed. The circuit board 20 extends from one edge of the second antenna portion 26 which here is also at least partially composed of circuit board material. It is within the scope of the present invention for the circuitry on the circuit board 20 to be any type of RFID circuits, microcontrollers, microprocessors, sensor circuits, signal processing circuits, and wireless devices configured to send and/or receive a signal. The second antenna portion 26 is supported by the antenna support 38, and the elements of the second antenna portion 26 are held together by the antenna block fasteners 32. The breaker bar 34 portion of the destruct mechanism 80 supports the end of the circuit board 20. The latch 36 is visible under the circuit board 20 and the pivot guides 52 for the breaker bar 34 are visible on either side of the breaker bar 34 and the latch 36. The board weakening feature 54 is the target area for breakage, wherein the circuit board 20 is laid out to have a critical portion of the circuitry on the frangible portion of circuit board 22 which will be broken off, thus rendering the circuit both inoperative and also very difficult to rapidly repair. Numerous prior art patents for tamper-proof RFID tags teach the severing of an antenna from an RFID circuit. The destruct mechanism of the present invention preferably severs numerous conductive paths in the actual RFID and signal processing circuitry, preferably with some active circuitry critical to circuit function on the severed portion of the circuit board. Further, no separate wires or other conductive means are needed, thus simplifying the electronic portion of the device and increasing reliability. The target area of the circuit board 20 is in this case rectangular although that is not an absolute requirement. In fact, it is not an absolute requirement for either section of the circuit board 20 or the antenna portions to be rectangular. The fiberglass and other composite materials commonly used for fabricating pc boards are designed to resist breakage. The frangible portion of circuit board 22 as shown is aided in breaking by the circuit board weakening features 54 which in the preferred embodiment are a row of perforations which may be circular, oval and slot-shaped, approximately in line with the pivoting point of the breaking mechanism, preferably as well as a V-groove cut into the board on one side approximately at the pivoting point. A V-groove can only be employed on one side of the board if surface traces are needed to make electrical contact between the circuit on the end portion and the rest of the circuit. However, if a multilayer board is employed it is possible to run all traces internally and have V-grooves on both surfaces. Ideally, the single V-groove depth is between ⅓ and ½ the thickness of the board. Rows of perforations and V-grooves are both well-known methods of producing breakaway regions on circuit boards, generally for panel separation. Additionally, the circuit board 20 is approximately 0.031" thick because thinner pc boards are easier to break. Note that any combination of break aiding features including the perforations, V-grooves, and thin substrate may be employed. The fragility of the frangible portion of circuit board 22 must be controlled to prevent a board which is too easily broken and thus prone to accidental failure.

Figure 6:
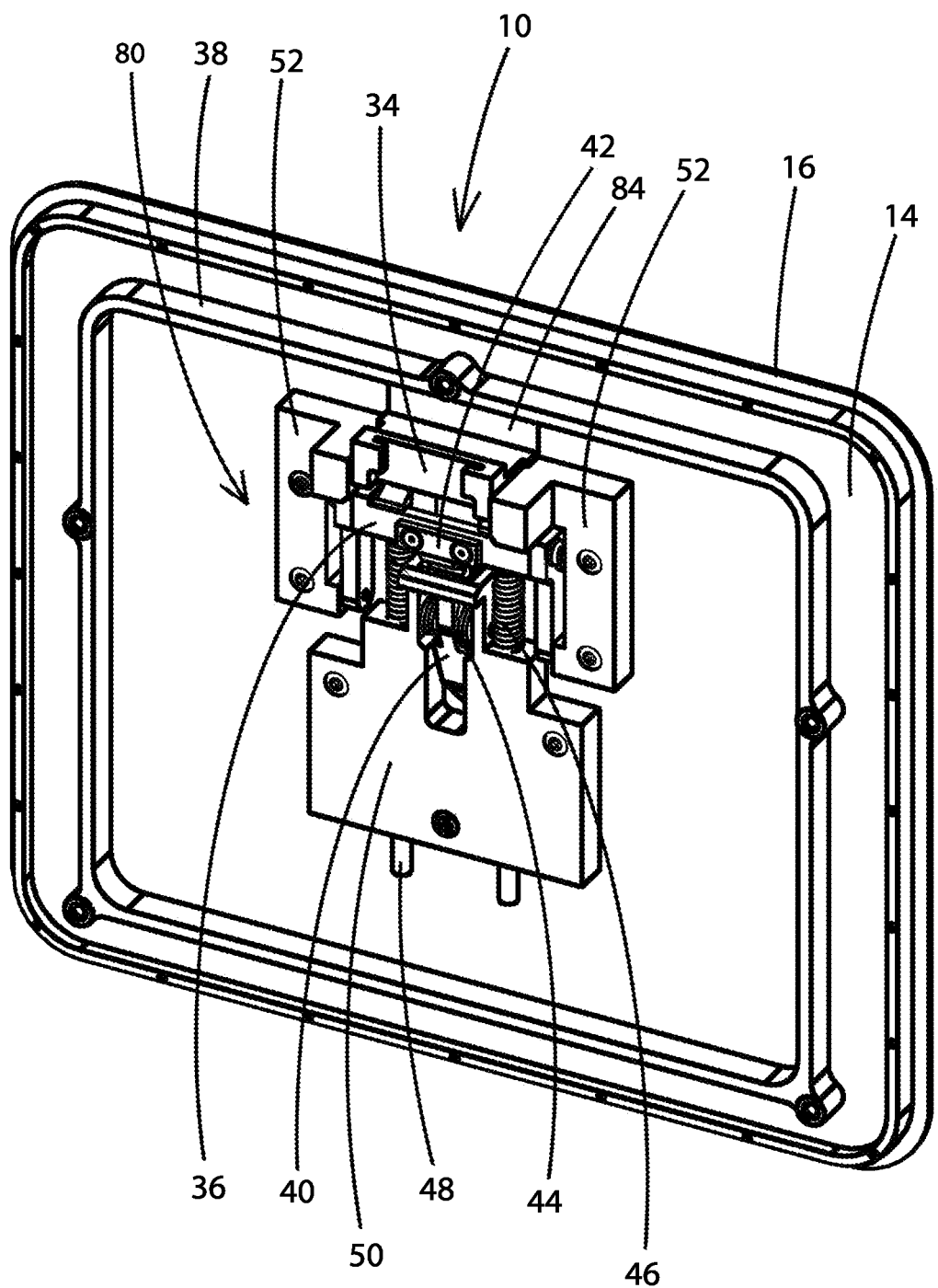
FIG. 6 is a perspective view of the enclosure base plate and destruct mechanism.
Figure 7:
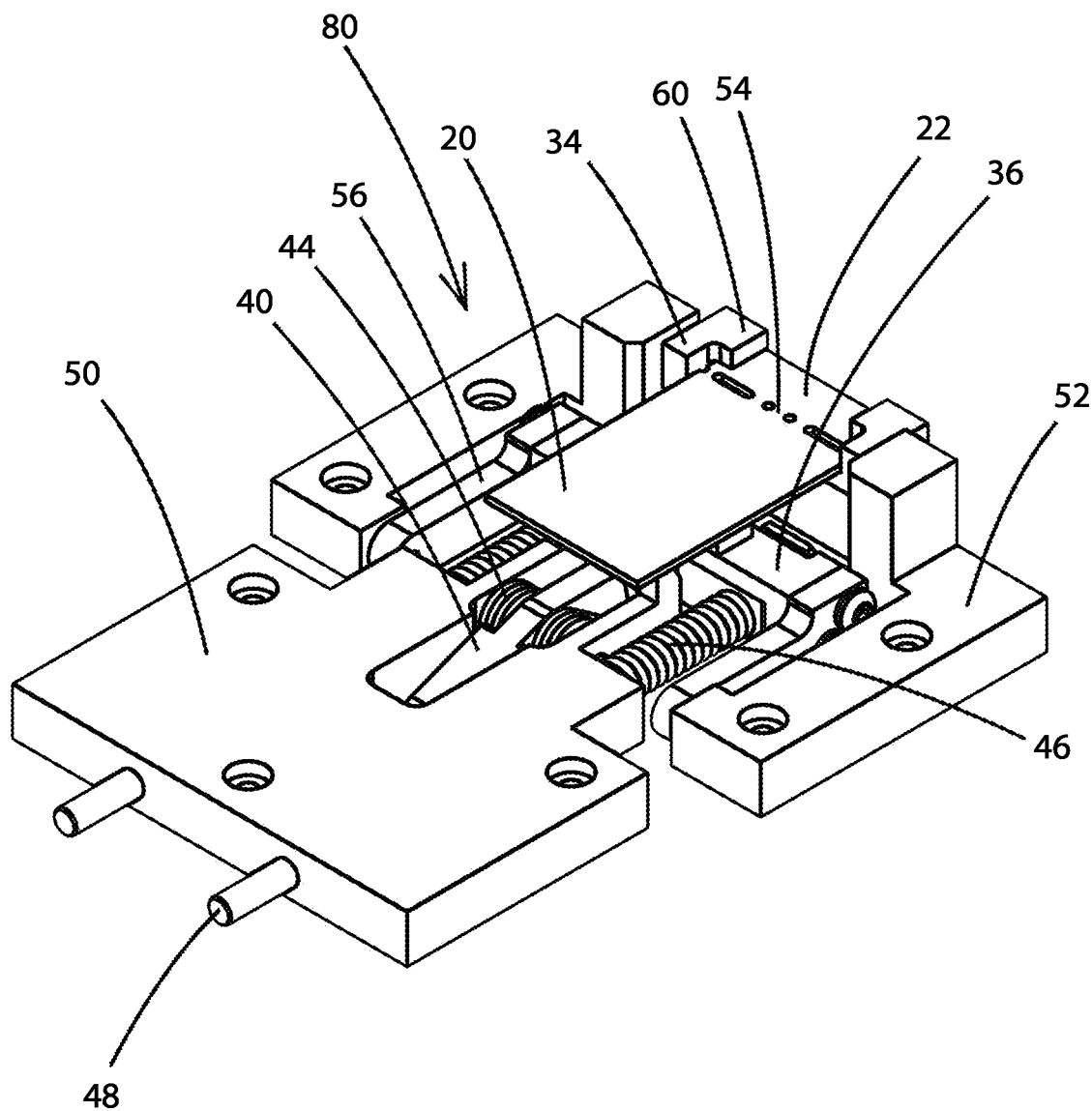
FIG. 7 is a perspective view of the destruct mechanism with the circuit board.
Figure 8:
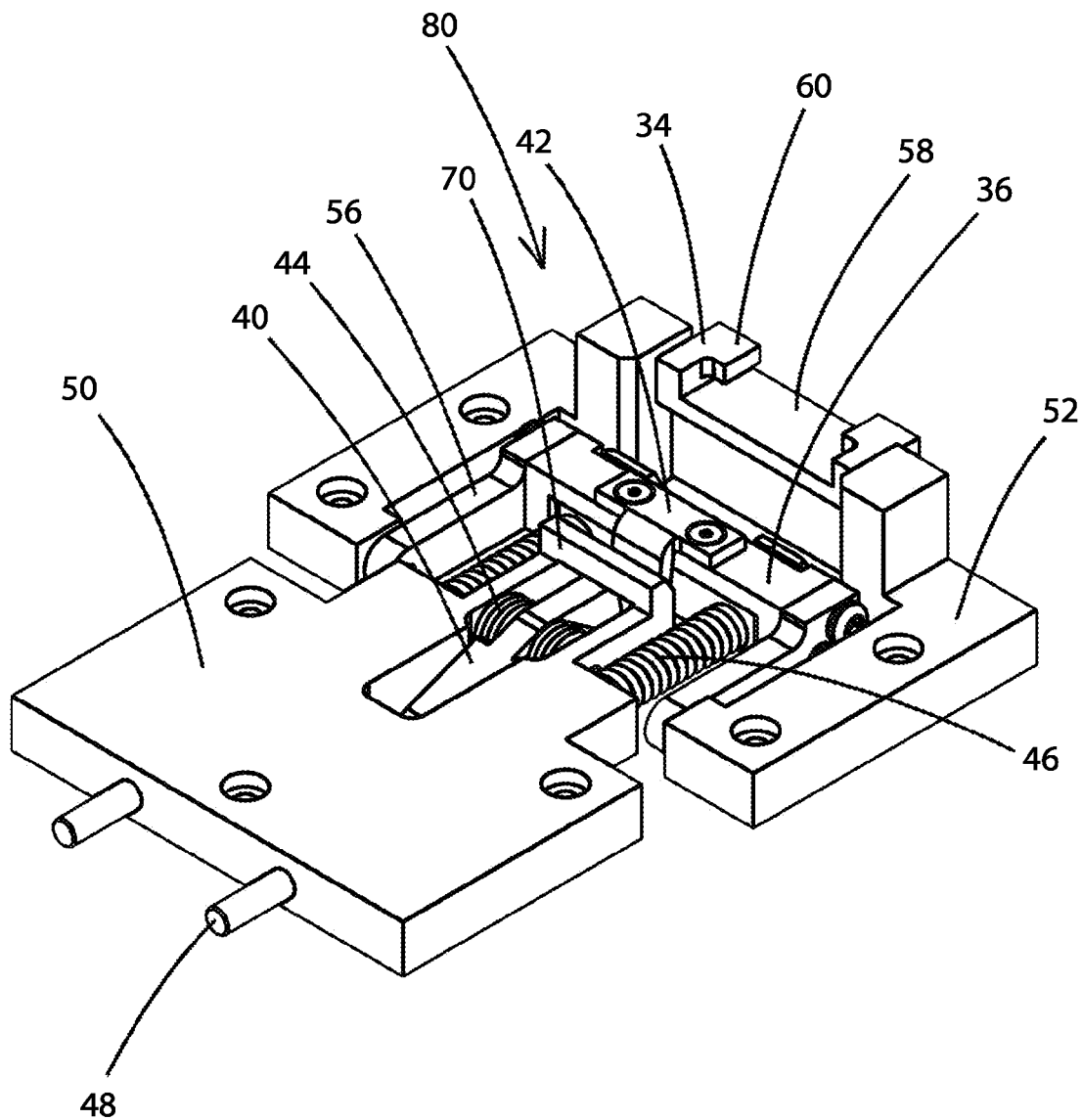
FIG. 8 is a perspective view of the destruct mechanism without the circuit board.
Figure 9:
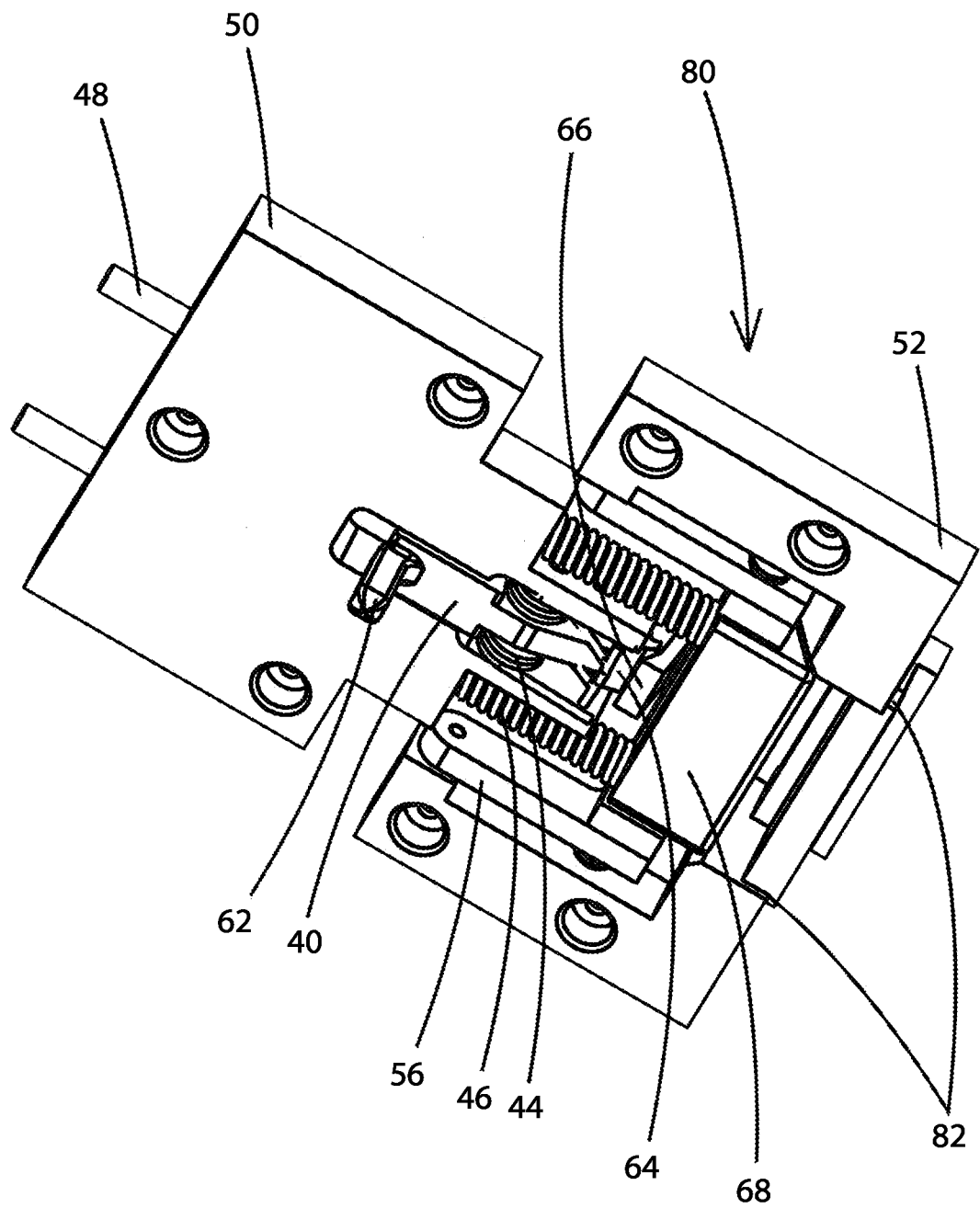
FIG. 9 is a bottom perspective view of the destruct mechanism.
Figure 10:
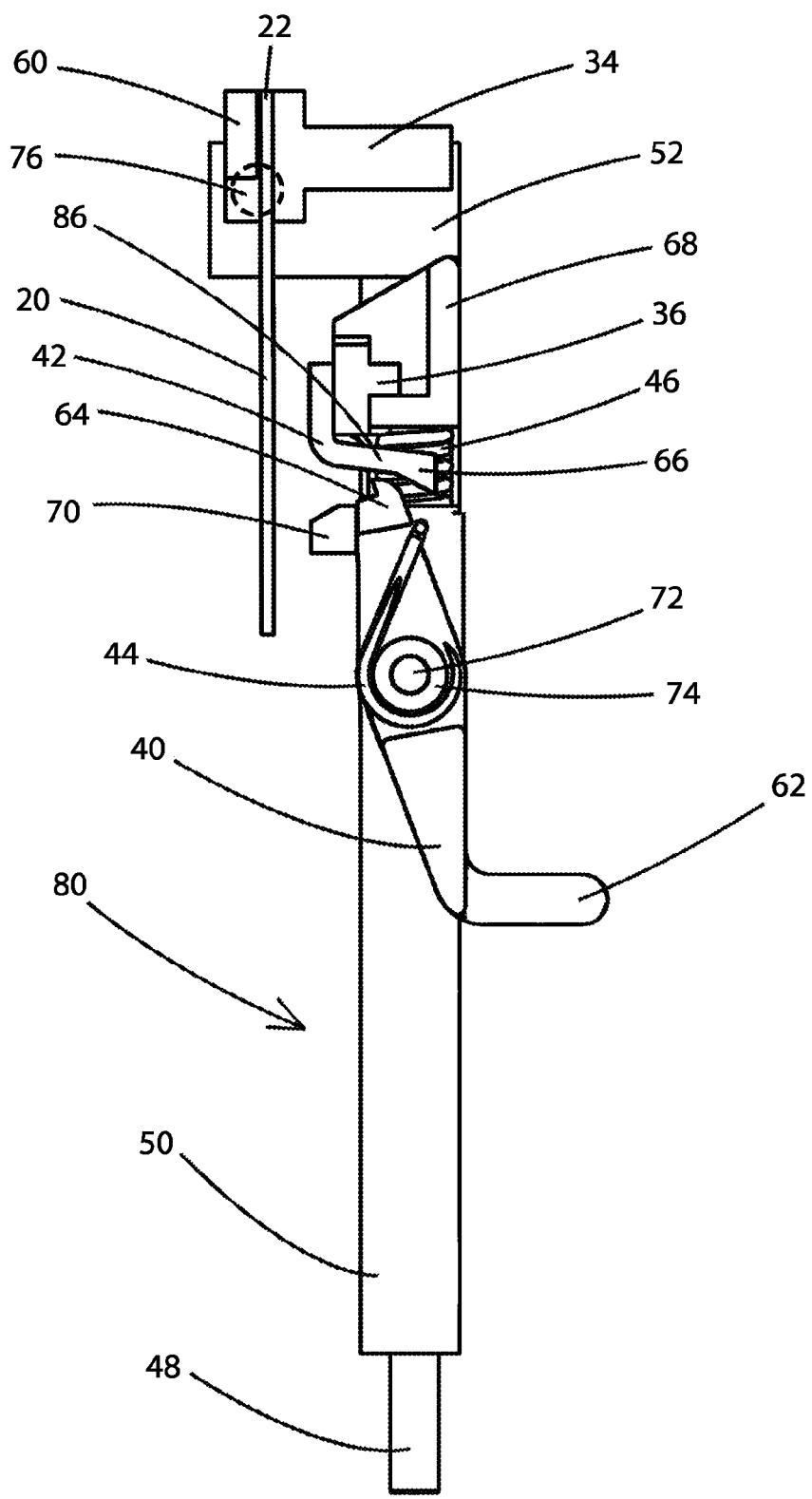
FIG. 10 is a side section view of the unarmed destruct mechanism.

FIG. 6 shows the destruct mechanism 80 mounted on the enclosure base 14, with the antennas and circuit board completely removed. Preferably, standard fasteners such as screws are used for the mounting. FIG. 7 shows the destruct mechanism 80 with the frangible portion of the circuit board 22 held in the breaker bar 34, while FIG. 8 shows the destruct mechanism 80 without any circuit boards. FIG. 9 shows the underside of the destruct mechanism 80. The frangible portion of circuit board 22 is supported by the circuit board support 58 portion of the breaker bar 34, and held in place by the circuit board retainer tabs 60. When not actuated, the breaker bar 34 is in a first bar position which serves to support and protect the frangible portion of the circuit board 22. Stop tabs 82 keep the breaker bar vertical against the pivot brackets 52, and provide a means for preventing uncontrolled rotation during non-tampering conditions. The spring block 50 serves to anchor the trigger 40 and a pair of trigger springs 44 which are preferably paired torsion springs, and to limit the upward motion of the front of the trigger 40 with the trigger retainer bar 70 to prevent the trigger 40 from having contact with the antenna assembly. The base 14 also constrains the motion of the trigger springs 44. The spring block 50 also provides channels for the guide rods 48 which guide the driver springs 46 which are preferably paired compression springs which produce the actual destructive force for breaking the frangible portion of circuit board 22, and the spring block 50 further serves as a backstop for the driver springs 46. The latch 36 has a pair of latch pivot arms 56 which rotate on two pivot pins in the pivot guides 52. The latch 36 can also be described as a pivoting latch bar having a latch portion, two latch pivot arms 56 and a pivot axis. The latch 36 engages the driver block 68 which rides on the guide rods 48 and is driven forward by the driver springs 46 when released. On top of the latch 36 the ratchet 42 is fastened. Preferably, an anti-friction plate 84 made of a relatively hard, smooth plastic such as polyester is inlaid flush into the enclosure base 14 in order to reduce sliding friction between the driver block 68 and the enclosure base 14 when the mechanism is actuated. The driver block 68 is preferably wedge shaped as shown in the present invention, in order to contact the edge of the breaker bar 34 furthest from the breaker bar pivots 76 which are shown in FIG. 10, and thereby exert the maximum torque on the breaker bar 34 to produce the maximum breaking force. The breaker bar pivots 76 are also held in the pivot guides 52. The driver springs 46 are compressed during initial assembly of the mechanism and remain so until triggering occurs. Similarly, the trigger springs 44 are compressed but only to an initial degree during assembly of the mechanism. The driver springs 46, driver block 68, and breaker bar 34 in combination form a force producing mechanism which functions to break the circuit board 20. When static, the components of this force producing mechanism are in first positions, and when actuated, the components of this force producing mechanism move rapidly to second positions wherein destructive action is performed. The ratchet 42 includes an attachment section which is preferably fastened to the latch 36 with screws, a resilient portion 86 in the middle, and a barb 66 at the end furthest from the attachment section. The trigger 40 has a trigger pin 62 at a first end and a trigger step 64 at a second end, where the trigger step 64 is configured to engage the barb 66 during actuation of the mechanism.

FIGS. 10-14 show side section views of the destruct mechanism 80, as the mechanism is static, then armed, and then triggered. In FIG. 10, the mechanism is static. Trigger pin 62 is fully extended by the trigger springs 44 and the trigger 40 is stopped in a first trigger position by the trigger retainer bar 70. The latch 36 in a first latch position holds the driver block 68 back against the force of the driver springs 46, in a first driver block position. The trigger step 64 is above the sloped barb 66 of the ratchet 42, and the trigger step 64 in combination with the ratchet 42 form the trigger arming mechanism. The frangible portion of the circuit board 22 is held in the breaker bar 34 and retained by the circuit board retainer tabs 60. The breaker bar pivot 76 is represented by a dashed circle to show how the upper surface of the circuit board 20 coincides with the center of the breaker bar pivots 76. The circuit board weakening feature 54 also is centered over the breaker bar pivots 76. The trigger 40 rotates on trigger pivot 72 which is held in the spring block 50, and the trigger springs 44 act upon the trigger 40 and rotate on the trigger spring liners 74 through which the trigger pivot 72 is inserted. Preferably for most efficient operation, the trigger 40, the trigger springs 44 and the latch pivot arms 56 all share a common axis of rotation.

Figure 11:
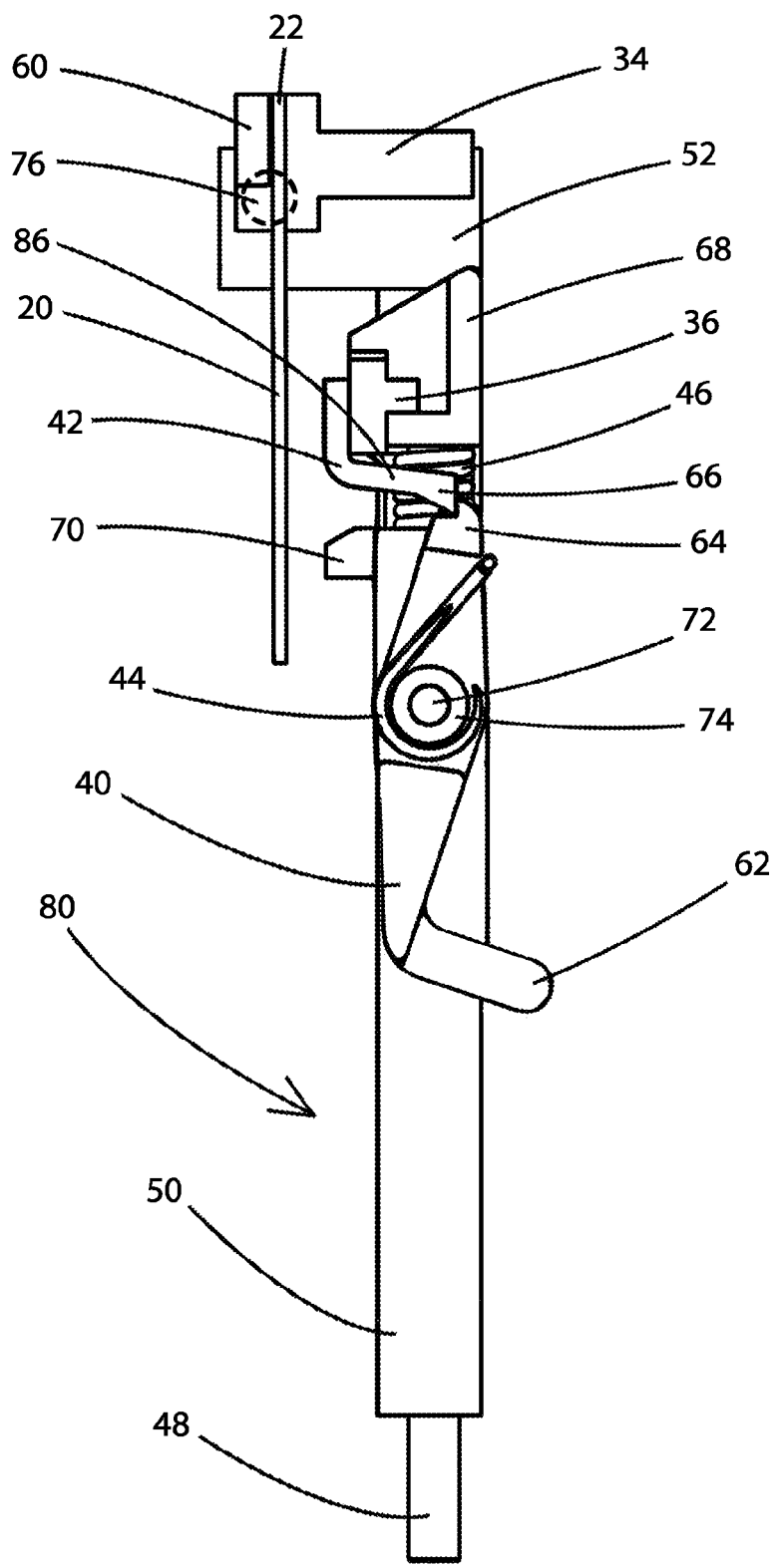
FIG. 11 is a side section view of the armed destruct mechanism.

FIG. 11 shows the mechanism armed, with the trigger pin 62 pushed up and the trigger step 64 having been rotated below the barb 66 of the ratchet 42, where the barb 66 has snapped back into place to engage the trigger step 64. The ratchet 42 is preferably injection molded from a durable polymer with a good mixture of flexibility and rigidity, such as polycarbonate. During the trigger pin 62 upward rotation, the downward rotation of the trigger step 64 will cause the curved face of the trigger step 64 to push against the sloped face of the barb 66, thereby bending the resilient portion 86 to move the barb 66 laterally so that the trigger step 64 can rotate to below the barb 66. Preferably, the rotation of the trigger step 64 is approximately adjacent and tangent to the middle or resilient portion 86 of the ratchet 42. The mechanism is configured to permit some overtravel by the trigger 40 in order to accommodate tolerances in parts manufacturing, assembly and use. Once the trigger step 64 has rotated past the barb 66 and the barb 66 has snapped back into place, the trigger 40 is in the second trigger position and the mechanism is armed. Since the tag enclosure 10 is sealed, once the mechanism is armed it cannot be disarmed.

Figure 12:
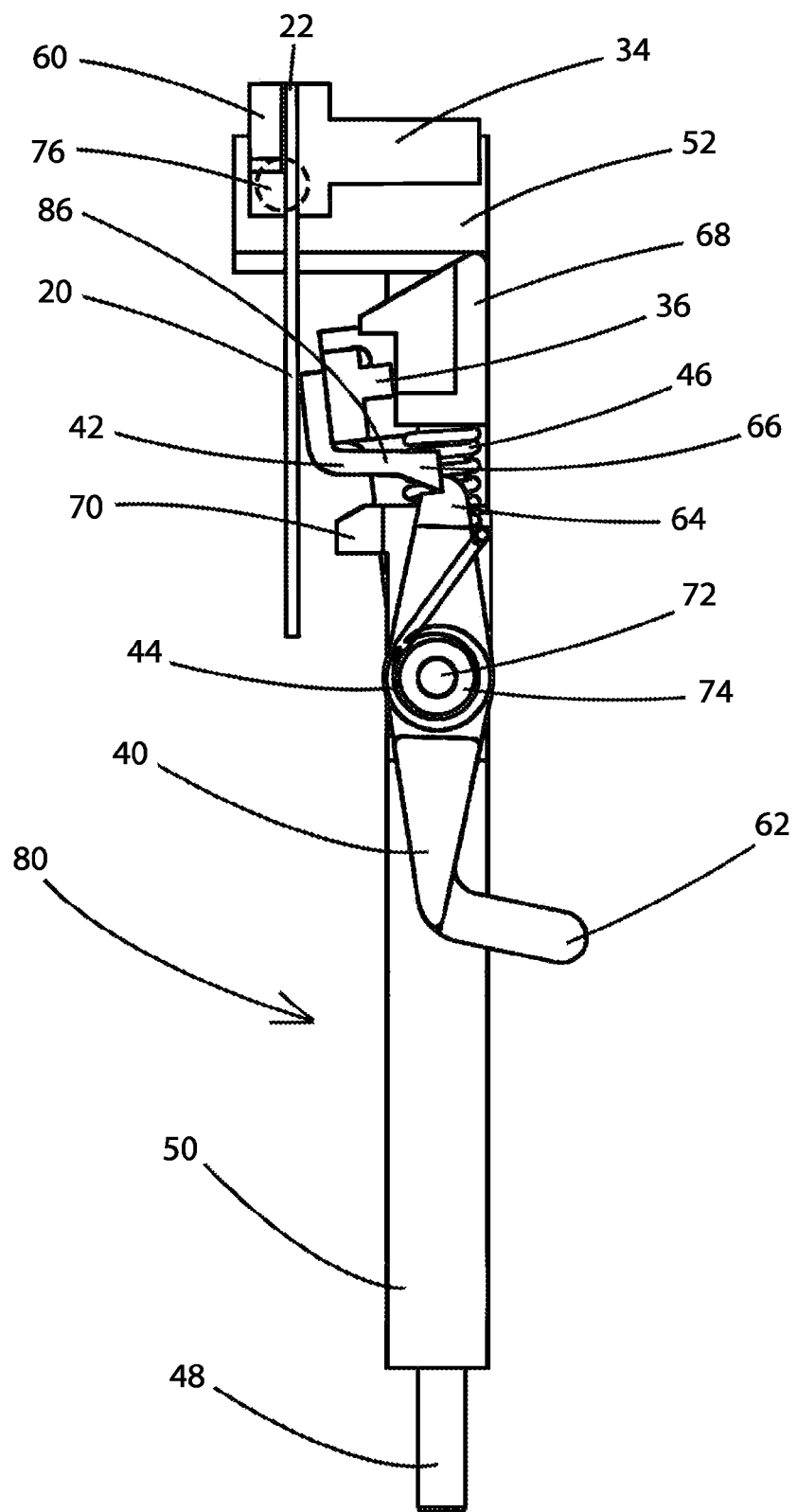
FIG. 12 is a side section view of the triggered destruct mechanism.

FIG. 12 shows the mechanism starting to actuate. The act of removing the attached enclosure 10 from a surface causes the trigger arming mechanism to actuate the latch, thereby actuating the anti-tamper mechanism. The trigger pin 62 has been allowed to rotate downwards, a result of force against the trigger pin 62 becoming less than the force exerted by the trigger springs 44. As the trigger 40 thus rotates, the trigger step 64 rotates upwards and lifts the barb 66 and thus the ratchet 42. The ratchet 42 is attached to the latch 36 which is thus lifted too, rotating around the axis of the latch pivot arms 56. Given the location of the latch 36 and the driver block 68 contact faces relative to the location of the pivot axis, the driver block 68 is initially forced to move backwards against the driver springs 46 to allow the latch 36 to clear the top of the driver block 68. Once the latch 36 clears the top of the driver block 68, the latch 36 is in the second latch position and the driver block 68 will be driven forward by the driver springs 46 towards a second driver block position. The mechanism has been designed with enough space between the latch 36 plus the ratchet 42 and the underside of the circuit board 20 that the latch 36 plus the ratchet 42 can rotate upwards successfully to clear the driver block 68.

There are two critical ratios for the mechanism to operate properly. The first critical ratio is trigger arming travel vs. trigger release travel. Ideally the trigger arming travel is in the range of 0.180" to 0.220", allowing safe handling and ease of application to a surface, plus approximately 0.020" to 0.030" of overtravel when arming as a safety margin. This safety margin accommodates manufacturing, assembly and use tolerances. Ideally the trigger release travel is in the range of 0.050" to 0.070", being enough travel to prevent any accidental triggering during application of the tag to a surface, but preventing tampering with the trigger during tag removal attempts. In the structure of the tag of the present invention, this translates to a lift angle of less than 2 degrees.

Figure 15:
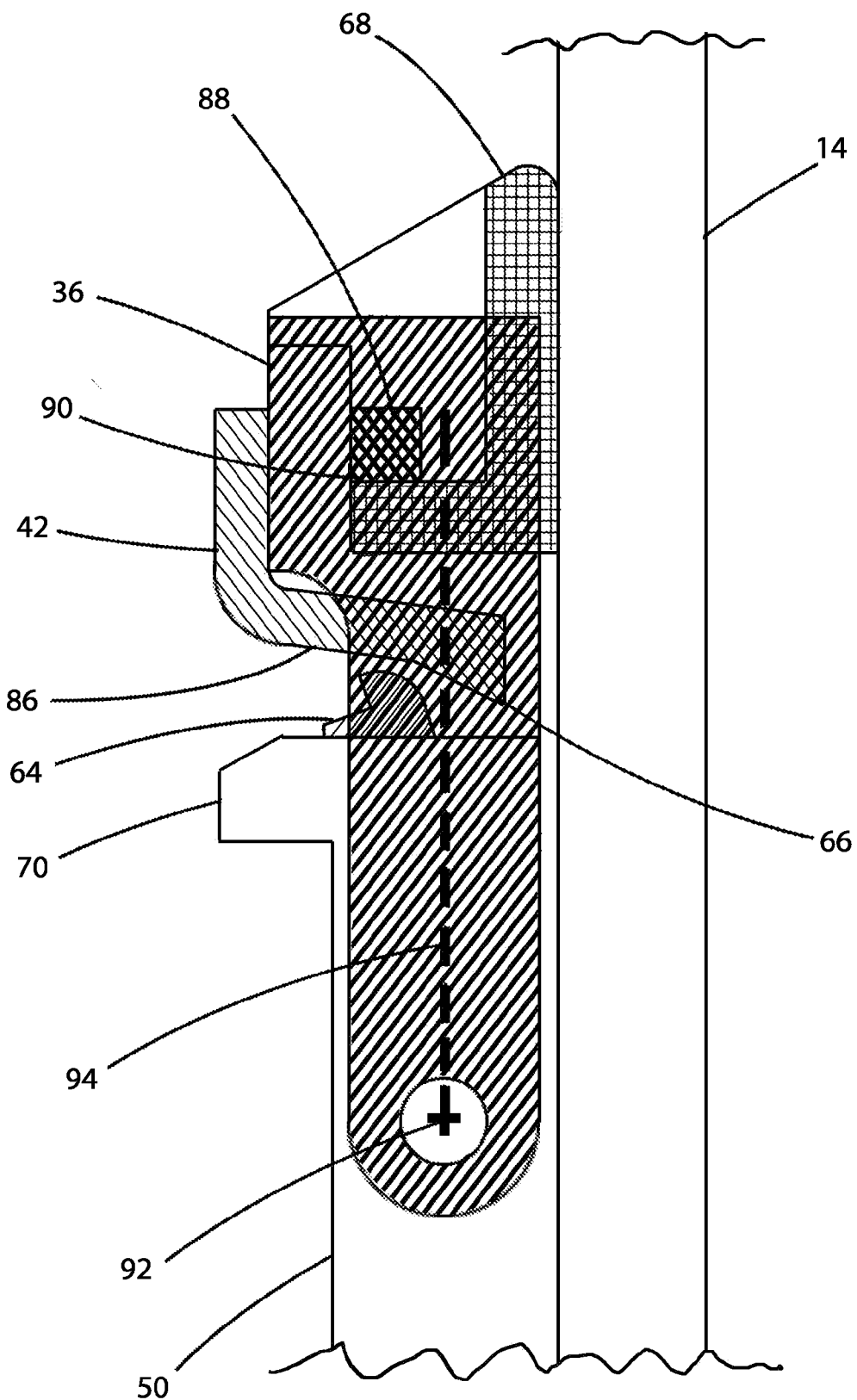
FIG. 15 shows a side section view of the latch engagement geometry.

The second critical ratio is latch pivot location and latch engagement depth versus the driver block backwards travel to release. This means for preventing accidental actuation comprises requiring the force producing mechanism to have an increase in stored mechanical energy before release of the force producing mechanism can occur. FIG. 15 shows the latch tab 88 portion of the latch 36 latching to and retaining the driver block 68. The area of retaining contact on the driver block 68 is the latch engagement region 90. By placing the latch pivot axis 92 below the latch engagement region 90, raising the latch 36 forces the driver block 68 to travel backwards a very small distance against the driver springs 44. This geometric relationship is further illustrated by the latch pivot reference line 94, which is seen as being below the latch engagement area 90. Therefore, more than just friction is holding the latch 36 in engagement with the driver block 68, and this required back motion serves to resist accidental release of the latch 36 against mechanical shock, impact, or vibration. Preferably, the trigger pivot 72 and the latch pivot axis 92 are coaxial. The length of the latch pivot arms 56 and engagement depth of the latch 36 with the driver block 68 are also critical factors in determining the distance the driver block 68 will have to move backwards in order to allow the latch 36 to release. An ideal latch engagement depth was found to be in the range of 0.065" to 0.085", and an ideal amount of driver block backwards travel was found to be in the range of 0.003" to 0.011", where the mechanism of the present invention as fabricated has approximately 0.007" of driver block 68 backwards travel. Having the trigger 40, the trigger springs 44 and the latch 36 share a common axis aids in reducing wasteful force components that could interfere with the desired rotational forces.

Without careful design and fabrication, the friction of the engagement between the latch 36 and the driver block 68 can easily become too much for the trigger springs 44 to overcome, resulting in a stalled mechanism when actuation is needed. The trigger springs 44 can be strengthened but that will reach a point of diminishing returns, and excessive back pressure on the trigger pin 62 may cause a mounting adhesive failure or flexible sheath 18 failure. Careful tradeoffs must be made between the trigger spring 44 force and the driver spring 46 force. Control of the friction between the latch 36 and the latch engagement region 90 of the driver block 68 is best accomplished by polishing the contacting surfaces of the latch engagement region 90, radiusing the contacting edges by approximately 0.005"-0.010", and applying a thick lubricant such as white lithium grease to the contacting surfaces. A small amount of lubricant is preferably applied to the guide rods 48 as well. The anti-friction plate 84 also improves the driver block 68 travel.

An additional mechanical constraint in the present invention is the need for the destruct mechanism 80 to be as low profile as possible to fit under the antenna assembly and not cause the full tag assembly to become excessively tall. The portion of the destruct mechanism which fits under the antenna assembly is less than or equal to 0.375" tall.

Figure 13:
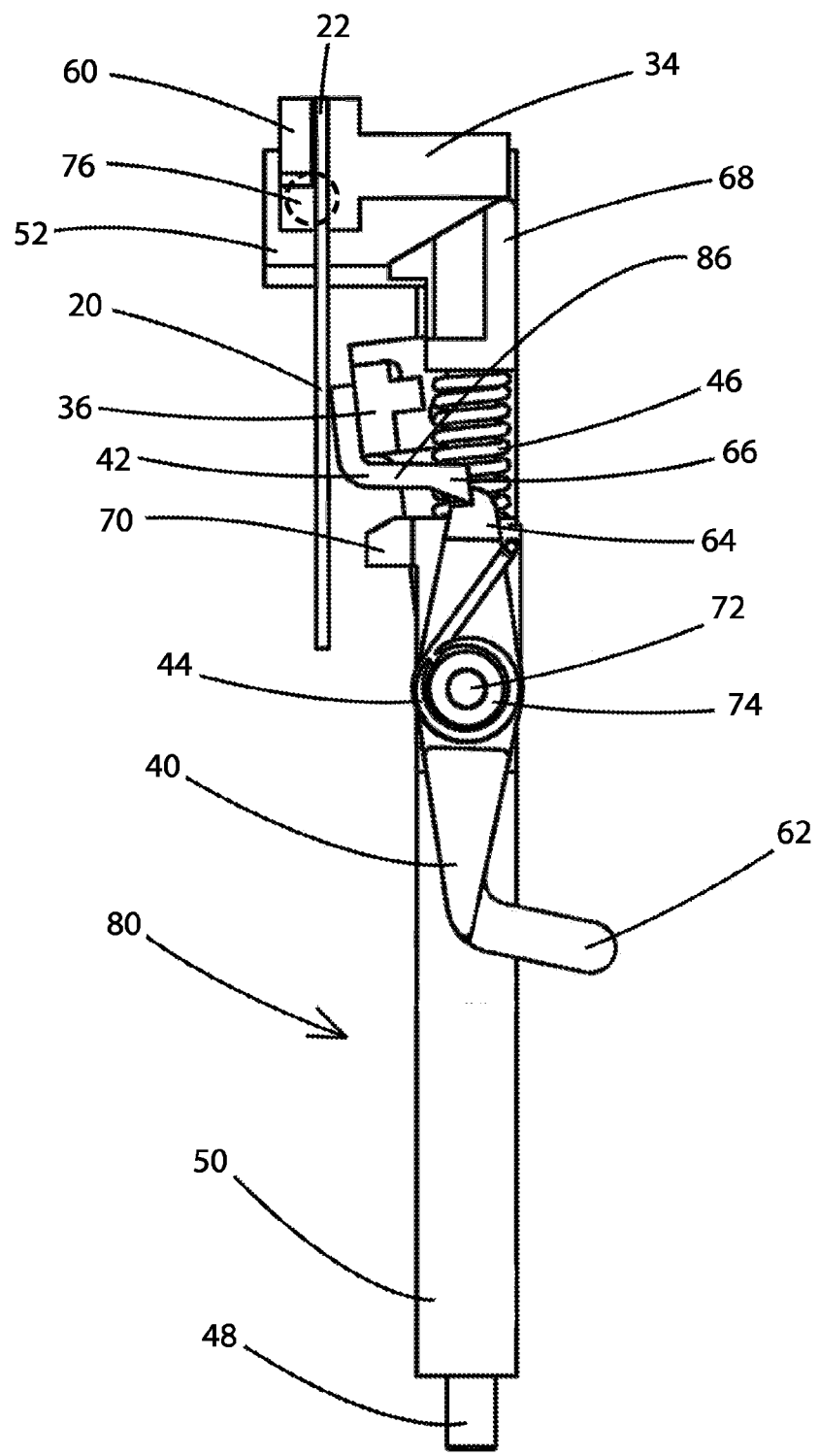
FIG. 13 is a side section view of the triggered destruct mechanism with the driver block forward.
Figure 14:
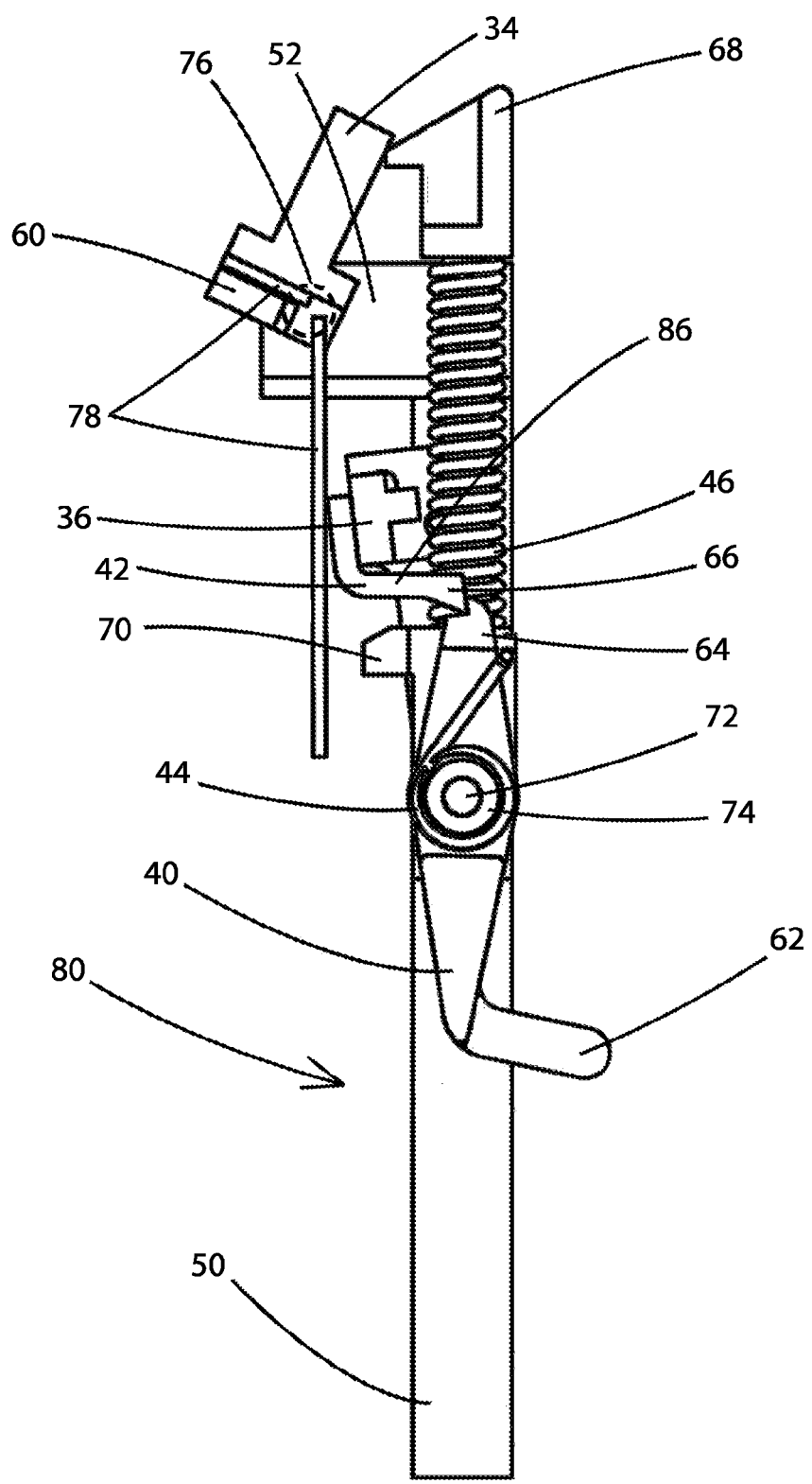
FIG. 14 is a side section view of the triggered destruct mechanism with the breaker bar pivoted up.

FIG. 13 shows the mechanism in mid-actuation. Once free of the latch 36, the driver block 68 is driven forward by the driver springs 46 and contacts the bottom edge of the breaker bar 34. In FIG. 14 the destruct action is complete, with the driver block 68 continuing to be driven forwards by the driver springs 46 towards a second driver block position and thus forcing the breaker bar 34 to pivot upwards towards a second bar position, resulting in a broken circuit board 78. The breaker bar 34 is capable of rotating at least but preferably more than 90 degrees, which adds to the assurance that the frangible portion of circuit board 22 will be fully detached and all conductive traces will be severed. The sequence of events in FIGS. 12-14 are rapid and violent, and can be clearly heard outside the secure RFID tag enclosure 10.

The destruct mechanism 80 parts are preferably made of stainless steel for the fasteners, rods and pivot pins, spring steel for the torsion and compression springs, and high strength aluminum for the other metal parts except for the trigger spring liners 74 located between the trigger pivot pin 72 and the trigger springs 44. The trigger spring liners 74 are preferably made of brass.

One unique benefit of the mechanism of the present invention is the ability to provide a significant amount of impact force in a very low-profile device, and have that force easily translated into a different plane, up to 90 degrees or greater from the direction of the primary impact force. The utility of the destruct mechanism of the present invention is not limited to breaking circuit boards and can provide a straight-line impact or as taught herein for circuit board breaking, may also be used to provide impact at an angle of 90 degrees or greater from the primary spring force direction in order to break frangible items such as glass tubes, glass plates, or any other suitably configured frangible item. In such a circumstance the end of the breaker bar 34 furthest from the breaker bar pivots 76 would preferably provide the impact.

Alternate embodiments of the present invention may include a reinforced polymer or composite enclosure base, different antenna geometries, and a circuit board that is separate from the antenna.

Alternate embodiments of the destruct mechanism may include multiple trigger pins, alternate triggering mechanisms, greater or lesser amounts of trigger arming and actuating travel, means for adjusting the trigger arming and actuating travel, means for safely disarming the trigger, transmission of impact force to break multiple items, and angled transmission of impact force over a distance inside the enclosure.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A circuit board anti-tamper mechanism comprising:
   a circuit board comprising at least a frangible portion;
   said frangible portion containing electronic circuitry;
   a trigger having a trigger spring;
      said trigger spring applying a release force to said trigger;
   a trigger arming mechanism actuated by said trigger;
      said trigger arming mechanism being initially non-actuated;
   a force producing mechanism;
   a latch providing mechanical communication between said trigger arming mechanism and said force producing mechanism;
      said latch initially retaining said force producing mechanism in a retracted position;
   wherein arming pressure applied to said trigger sufficient to overcome said release force will actuate said trigger arming mechanism, causing said anti-tamper mechanism to be armed; and
   wherein subsequent tampering with said anti-tamper mechanism results in a decrease of pressure on said trigger below the pressure of said release force, thereby causing said trigger arming mechanism to actuate said latch, thereby releasing said force producing mechanism, thereby permitting said force producing mechanism to apply force to said circuit board, thereby fragmenting said circuit board and rendering said electronic circuit portion non-functional.

2. The circuit board anti-tamper mechanism of claim 1, wherein attaching said anti-tamper mechanism to a surface causes said trigger to actuate said trigger arming mechanism.

3. The circuit board anti-tamper mechanism of claim 1, wherein said frangible portion of said circuit board is made frangible by features selected from the group consisting of holes, slots, and V-grooves.

4. The circuit board anti-tamper mechanism of claim 1, wherein said frangible portion contains active circuitry, thereby substantially increasing the difficulty of repairing said RFID circuit if said anti-tamper mechanism is actuated.

5. The circuit board anti-tamper mechanism of claim 4, wherein said active circuitry includes circuitry from the group consisting of RFID circuits, microcontrollers, microprocessors, sensor circuits, signal processing circuits, and wireless device circuits.

6. The circuit board anti-tamper mechanism of claim 1, wherein the range of trigger motion necessary to actuate said trigger arming mechanism is the trigger arming travel and the range of trigger motion necessary to result in the actuation of said latch is the trigger release travel; and
said trigger arming travel is greater than said trigger release travel.

7. The circuit board anti-tamper mechanism of claim 6, wherein said trigger arming travel is in the range of approximately 0.180 inches to 0.220 inches and said trigger release travel is in the range of approximately 0.050 inches to 0.070 inches.

8. The circuit board anti-tamper mechanism of claim 1, further comprising:
an enclosure;
at least the majority of said anti-tamper mechanism including said circuit board being enclosed within said enclosure;
said enclosure providing environmental protection and visual concealment to said anti-tamper mechanism and said circuit board;
a portion of said trigger protruding outside of said enclosure; and
said enclosure including means for environmentally sealing around said protruding portion of said trigger, while permitting said trigger to move as required for arming and release.

9. The circuit board anti-tamper mechanism of claim 8, wherein means for environmental sealing comprises said protruding portion of said trigger being enclosed in an opaque flexible sheath sealed to said enclosure, thereby permitting external arming and release of said trigger while maintaining environmental protection and visual concealment of the contents of said enclosure.

10. The circuit board anti-tamper mechanism of claim 8, further comprising:
said enclosure at least partially comprising a base and a cover; and
an adhesive covering at least a portion of said base for the purpose of attaching said enclosure to a surface.

11. The circuit board anti-tamper mechanism of claim 10, wherein said adhesive is a continuous ring of Very High Bond (VHB) tape approximately bordering the periphery of said base;
said adhesive thereby enclosing a region of said base when said base is attached to a surface;
said adhesive thereby providing an environmental seal to said enclosed region of said base when said base is attached to a surface;
wherein said protruding portion of said trigger is disposed within said enclosed region of said base when said base is attached to a surface; and
thereby said trigger is environmentally sealed.

12. The circuit board anti-tamper mechanism of claim 10, wherein said base is made of a lightweight durable metal and said cover is made of a durable polymer; and
said cover is permanently affixed and environmentally sealed to said base with a structural adhesive.

13. The circuit board anti-tamper mechanism of claim 10, wherein the act of attaching said enclosure to a surface with said adhesive causes said trigger arming mechanism to be actuated.

14. The circuit board anti-tamper mechanism of claim 13, wherein the act of removing said attached enclosure from a surface causes said trigger arming mechanism to actuate said latch, thereby actuating said anti-tamper mechanism and fragmenting said circuit board.

15. The circuit board anti-tamper mechanism of claim 1, wherein once said anti-tamper mechanism is armed, said anti-tamper mechanism cannot be disarmed.

16. The circuit board anti-tamper mechanism of claim 1, wherein said latch includes means for preventing accidental actuation caused by mechanical shock, impact, or vibration.

17. The circuit board anti-tamper mechanism of claim 16, wherein said means for preventing accidental actuation comprises requiring said force producing mechanism to have an increase in stored mechanical energy before said releasing of said force producing mechanism can occur.

18. An anti-tamper mechanism comprising:
a pivoting trigger having a first end, a second end, and a longitudinal portion therebetween;
said longitudinal portion having a transversely oriented trigger pivot axis;
at least one trigger spring providing downward force to said first end and upward force to said second end;
a pivoting latch bar having a latch portion and a latch pivot axis;
a ratchet having a barb, a means for attachment, and a resilient portion therebetween;
said ratchet means for attachment being affixed to said pivoting latch bar;
a force producing mechanism having a latch engagement region;
said force producing mechanism being movable between a first position and a second position;
said force producing mechanism further comprising at least one driver spring;
said driver spring being compressed in said first position;
said driver spring urging said force producing mechanism from said first position towards said second position;
a frangible item located in the path of said force producing mechanism;
wherein said latch portion in said first latch bar position latches to said latch engagement region thereby retaining said force producing mechanism in said first position, said latch engagement region being urged against said latch portion by said driver spring;
said trigger being pivotable between a first trigger position and a second trigger position, wherein said trigger spring urges said trigger towards said first trigger position, thereby configuring said first trigger end into a ready-to-arm position and said second trigger end into a position unengaged from said barb;
wherein an unarmed state for said pivoting latch bar includes said trigger being in said first trigger position, said pivoting latch bar being in said first latch position, said force producing mechanism being in said first position;
wherein a force applied to said first trigger end sufficient to overcome the force of said trigger spring thereby causes rotation of said trigger from said first trigger position to said second trigger position, thereby causing said second trigger end to rotate past said barb, said barb deflecting from the rotation of said second trigger end by the flexure of said resilient portion, said barb returning to approximately a pre-deflection position after passage of said second trigger end, thereby configuring said anti-tamper mechanism into an armed state; and wherein subsequent tampering causes a reduction in said force against said first trigger end to be less than said force exerted by said trigger spring, causing rotation of said trigger from said second trigger position towards said first trigger position, causing said second trigger end to rotate upwards against said barb and thereby transmit the force of said trigger spring through said ratchet to said latch, thereby causing said pivoting latch bar to rotate about said latch pivot axis from said first latch position to said second latch position, thereby providing latch actuation and releasing said force producing mechanism from said latch bar, thereby permitting said driver spring to move at least a portion of said force producing mechanism into contact with said frangible item, and thereby to cause the breakage of said frangible item.

19. The anti-tamper mechanism of claim 18, wherein said force producing mechanism further comprises:

a driver block partially comprising said latch engagement region;

said driver block being movable between a first driver block position and a second driver block position;

said driver spring being in mechanical communication with said driver block;

said driver spring urging said driver block from said first driver block position towards said second driver block position;

said latch portion in said first latch bar position latching to said latch engagement region and thereby retaining said driver block in said first driver block position;

said latch engagement region being urged against said latch portion by said driver spring;

a breaker bar having a breaker bar pivot;

said breaker bar being rotatable around said breaker bar pivot between a first bar position and a second bar position;

wherein said driver block traveling from said first driver block position towards said second driver block position will impact said breaker bar in said first bar position and move said breaker bar towards said second bar position;

wherein the arc described between said first bar position and said second bar position defines a pivoting path;

said frangible item being located in the pivoting path of said breaker bar; and wherein causing said pivoting latch bar to rotate about said latch pivot axis from said first latch position to said second latch position thereby releases said driver block from said latch bar, thereby permitting said driver spring to move said driver block into contact with said breaker bar in said first bar position, the impact of said driver block causing said breaker bar to rotate about said breaker bar pivot towards said second bar position, thereby causing contact between said breaker bar and said frangible item along said pivoting path to break said frangible item.

20. The anti-tamper mechanism of claim 19, wherein said arc includes angles up to at least 90 degrees, thereby providing a means for applying destructive force to said frangible item at an angle of at least 90 degrees from the movement direction of said driver spring.

21. The anti-tamper mechanism of claim 18, wherein said trigger pivot axis and said latch pivot axis are approximately coaxial, thereby minimizing latch actuation force.

22. The anti-tamper mechanism of claim 18, wherein said driver spring is paired parallel compression springs, and said trigger spring is paired torsion springs.

23. The anti-tamper mechanism of claim 18, wherein trigger travel distance from said first trigger position to said second trigger position is greater than trigger travel distance from said second trigger position to providing said latch actuation.

24. The anti-tamper mechanism of claim 23, wherein trigger travel distance from said first trigger position to said second trigger position is in the range of approximately 0.180 inches to 0.220 inches and trigger travel from said second trigger position to providing said latch actuation is in the range of approximately 0.050 inches to 0.070 inches.

25. The anti-tamper mechanism of claim 18, wherein the orientation of said resilient portion is approximately adjacent and tangent to the rotation of said second trigger end.

26. The anti-tamper mechanism of claim 18, wherein the main portion of said anti-tamper mechanism not including said first trigger end in said first trigger position has a thickness less than or equal to 0.375 inches.

27. The anti-tamper mechanism of claim 18, wherein said first trigger end further comprises a trigger pin oriented substantially orthogonal to said longitudinal portion.

28. The anti-tamper mechanism of claim 18, wherein said second trigger end further comprises a step feature for positive engagement of said barb.

29. The anti-tamper mechanism of claim 18, wherein said pivoting latch bar and said driver spring are configured to retain said latch portion against said latch engagement region whereby release rotation of said pivoting latch bar requires said force producing mechanism to further compress said driver spring by an incremental amount, thereby preventing mechanical shock, impact or vibration from causing accidental release of said pivoting latch bar.

30. The anti-tamper mechanism of claim 29, wherein said incremental amount is in the range of approximately 0.003 inches to 0.011 inches.

31. The anti-tamper mechanism of claim 18, wherein said frangible item comprises at least a portion of a printed circuit board having at least a portion of an electronic circuit thereon; and
   said portion made frangible by the addition of features selected from the group consisting of holes, slots, and grooves.

32. The anti-tamper mechanism of claim 31, wherein said printed circuit board contains an electronic circuit including circuitry from the group consisting of RFID circuits, microcontrollers, microprocessors, sensor circuits, signal processing circuits, and wireless device circuits.

33. The anti-tamper mechanism of claim 18, wherein at least the majority of said anti-tamper mechanism including said frangible item are enclosed within an enclosure;
   said enclosure at least partially comprising a base and a cover;
   said enclosure providing environmental protection and visual concealment to said anti-tamper mechanism and said frangible item; and
   a portion of said trigger protrudes outside of said enclosure.

34. The anti-tamper mechanism of claim 33, wherein said enclosure includes means for environmentally sealing around said protruding portion of said trigger, while permitting said trigger to move as required for arming and release.

35. The anti-tamper mechanism of claim 34, wherein means for environmental sealing comprises said protruding portion of said trigger being enclosed in an opaque flexible sheath sealed to said enclosure, thereby permitting external arming and release of said trigger while maintaining environmental protection and visual concealment of the contents of said enclosure.

36. The anti-tamper mechanism of claim 33, wherein said portion of said trigger protrudes approximately from the center of said base.

37. The anti-tamper mechanism of claim 33, wherein said base is made of a lightweight durable metal and said cover is made of a durable polymer; and said cover is permanently affixed and environmentally sealed to said base with a structural adhesive.

38. The anti-tamper mechanism of claim 33, further comprising an adhesive covering at least a portion of said base for the purpose of attaching said enclosure to a surface.

39. The anti-tamper mechanism of claim 38, wherein said adhesive is a continuous ring of Very High Bond (VHB) tape approximately bordering the periphery of said base;

said adhesive thereby enclosing a region of said base when said base is attached to a surface;

said adhesive thereby providing an environmental seal to the enclosed region of said base when said base is attached to a surface;

wherein said protruding portion of said trigger is disposed within said enclosed region of said base when said base is attached to a surface; and thereby said protruding portion of said trigger is environmentally sealed.

40. The anti-tamper mechanism of claim 38, wherein the act of attaching said enclosure to a surface with said adhesive causes said protruding portion of said trigger to be depressed, thereby causing said anti-tamper mechanism to enter an armed condition.

41. The anti-tamper mechanism of claim 40, wherein the act of removing said attached enclosure from a surface causes said protruding portion of said trigger to be released, thereby actuating said anti-tamper mechanism.

42. The anti-tamper mechanism of claim 18, wherein once said anti-tamper mechanism is armed, said anti-tamper mechanism cannot be disarmed.

43. A secure RFID tag comprising:

an RFID tag comprising an RFID circuit and an antenna;
    at least a portion of said RFID tag comprising a frangible portion;
an enclosure enclosing said RFID tag;
an adhesive covering at least a portion of one face of said enclosure for attaching said enclosure to a surface;
an anti-tamper mechanism configured to cause breakage of said frangible portion and thereby permanent loss of function of said RFID tag;
said anti-tamper mechanism further comprising a trigger protruding from said face;
said anti-tamper mechanism further comprising means for preventing accidental actuation caused by mechanical shock, impact, or vibration; and
whereby if said secure RFID tag is attached to a surface with said adhesive, pressure against said trigger causes said anti-tamper mechanism to become armed;
whereby subsequent reduction of pressure against said trigger will cause actuation of said anti-tamper mechanism; and
thereby tampering by separation of said secure RFID tag from said surface will result in reduction of pressure against said trigger and consequent actuation of said anti-tamper mechanism, thereby causing breakage of said frangible portion and thereby permanent loss of function of said RFID tag.

44. The secure RFID tag of claim 43, wherein said frangible portion includes active circuitry, thereby greatly increasing the difficulty of repairing said RFID circuit if tampering occurs.

45. The secure RFID tag of claim 43, wherein said adhesive is a continuous ring of Very High Bond (VHB) tape approximately bordering the periphery of said face;

said adhesive thereby enclosing a region of said face when said enclosure is attached to a surface;

said adhesive thereby providing an environmental seal to said enclosed region;

whereby said protruding portion of said trigger is disposed within said enclosed region and environmentally sealed when said enclosure is attached to a surface; and thereby providing an environmental seal to said trigger.

46. The secure RFID tag of claim 43, wherein said enclosure includes means for environmentally sealing around said protruding portion of said trigger, while permitting said trigger to move as required for arming and actuation.

47. The secure RFID tag of claim 46, wherein means for environmental sealing comprises said protruding portion of trigger pin being enclosed in a flexible sheath sealed to said enclosure, thereby permitting external arming of said trigger and actuation of said anti-tamper mechanism while maintaining environmental protection and visual concealment of the contents of said enclosure.

48. The secure RFID tag of claim 43, wherein the range of trigger motion necessary to actuate said anti-tamper mechanism is the trigger arming travel and the range of trigger motion necessary to result in the actuation of said anti-tamper mechanism is the trigger release travel; and said trigger arming travel is greater than said trigger release travel.

49. The secure RFID tag of claim 48, wherein said trigger arming travel is in the range of 0.180 inches to 0.220 inches and said trigger release travel is in the range of 0.050 inches to 0.070 inches.

50. The secure RFID tag of claim 43, wherein once said anti-tamper mechanism is armed, said anti-tamper mechanism cannot be disarmed.

* * * * *